United States Patent
Wang

(10) Patent No.: US 6,956,513 B1
(45) Date of Patent: Oct. 18, 2005

(54) ERROR FEEDBACK STRUCTURE FOR DELTA-SIGMA MODULATORS WITH IMPROVED STABILITY

(75) Inventor: Minsheng Wang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/969,852

(22) Filed: Oct. 22, 2004

(51) Int. Cl.$^7$ .............................................. H03M 3/00
(52) U.S. Cl. ...................... 341/143; 341/144; 341/155
(58) Field of Search ................................ 341/143–144, 341/155

(56) References Cited

U.S. PATENT DOCUMENTS

| | | | | |
|---|---|---|---|---|
| 4,467,316 A | * | 8/1984 | Musmann et al. | 341/144 |
| 4,528,551 A | * | 7/1985 | Agrawal et al. | 341/143 |
| 4,692,737 A | * | 9/1987 | Stikvoort et al. | 341/50 |
| 4,859,883 A | * | 8/1989 | Bradinal | 327/311 |
| 5,202,685 A | * | 4/1993 | Nagata | 341/76 |
| 5,252,973 A | * | 10/1993 | Masuda | 341/131 |
| 5,999,347 A | * | 12/1999 | Ichimura et al. | 360/32 |
| 6,642,874 B1 | * | 11/2003 | Lin et al. | 341/143 |

OTHER PUBLICATIONS

Delta-Sigma Data Converters Theory, Design, and Simulation (Norsworthy, Steven R. et al. ed., Institute of Electrical and Electronics Engineers, Inc. 1997) pp. 313-315, No month.

Nans, Peter J. A. et al., "A CMOS Stereo 16-bit D/A Converter for Digital Audio," IEEE Journal of Solid-State Circuits, vol. SC-22, No. 3, Jun. 1987, pp. 390-395.

Stikvoort, Eduard F., "Some Remarks on the Stability and Performance of the Noise Shaper or Sigma-Delta Modulator", IEEE Transactions on Communcations, vol. 36, No. 10, IEEE, Oct. 1998, pp. 1157-1162.

* cited by examiner

*Primary Examiner*—Michael Tokar
*Assistant Examiner*—Khai M. Nguyen
(74) *Attorney, Agent, or Firm*—Sterne, Kessler, Goldstein & Fox PLLC

(57) ABSTRACT

An error feedback circuit includes a first summer receiving an analog input signal and a feedback signal and outputting a summed signal. A quantizer receives the summed signal and outputs a quantized output signal. A limiter receives the summed signal and outputs a limited summed signal. The limiter limits the limited summed signal to $\alpha$*(maximum value of input signal), $\alpha>1$. A second summer receives the limited summed signal and the output signal and outputs an error signal. A filter receives the error signal and outputting the feedback signal. Typically, $1.0<\alpha<2.0$, more preferably $1.4<\alpha<1.6$. The filter has a transfer function of $H_1(z)= 2z^{-1}-z^{-2}$.

8 Claims, 7 Drawing Sheets

ERROR FEEDBACK STRUCTURE FOR DELTA-SIGMA MODULATORS WITH IMPROVED STABILITY

BACKGROUND OF THE INVENTION

1. Field of the Invention

The present invention is related to sigma delta modulators, and more particularly to delta-sigma modulators with improved stability at full range.

2. Related Art

Analog to Digital Converters (ADCs) are well known in the art for converting an analog input voltage into a digital output signal as a number of bits. Normally there is a linear correlation between an input voltage and a digital output value.

So-called Delta-Sigma ADCs are known in the art, which use an oversampling approach to convert the input analog signal, using integrators, comparators and digital filters, into a digital output signal. Description of this type of ADC and some embodiments can be found, e.g., in "Delta-Sigma Data Converters: Theory, Design, and Simulation," by Steven R. Norsworthy (1996).

The advantage of Delta-Sigma ADCs is its insensitivity to imperfections and tolerances of the analog part of the ADC.

FIG. 1 illustrates a conventional error feedback (EFB) structure used in Delta-Sigma modulators. As shown in FIG. 1, an input signal X is received at a summer 102, and is inputted to a quantizer 104. The quantizer 104 outputs an output signal Y, which is also fed back to a second summer 106, together with the signal from the first summer 102. The second summer 106 outputs an error signal e, which is inputted into a filter 108 having a transfer function $H_1$. The output of filter 108 is then fed back to the first summer 102. The transfer function of the output is given by:

$$Y(z)=X(z)+[1-H_1(z)]*E(z) \quad \text{(Eq. 1)}$$

where $H_1(z)$ is the filter 108 transfer function, and Y, X and E are the z-transforms of the output y, the input x, and the quantization error e of the modulator. As shown in Eq. 1, the noise transfer function of the error feedback modulator is $1-H_1(z)$. To achieve second order noise shaping, the feedback filter transfer function can be selected as $H_1(z)=2z^{-1}-z^{-2}$, which results in the second order noise shaping $1-H_1(z)=(1-z^{-1})^2$. The transfer function $H_1$ of filter 108 thus gives second order noise shaping of the error signal.

The error feedback modulator has a relatively low cost of hardware and low power consumption, and, therefore, has been widely used in the low-power applications, such as digital voice and audio. This error feedback modulator, however, is subject to overflow when the modulator is over-driven. In another words, when the input is close to or greater than the full-scale (Fs) of the input, the quantization error -e in FIG. 1 becomes unbounded, driving the modulator towards oscillation and instability. In other words, the structure shown in FIG. 1, as noted above, has a stability problem when the input X is close to full scale (Fs). This results in extremely poor signal-to-noise plus distortion ratio (SNDR). To prevent overflow, a limiter has to be used, as shown in FIG. 2 (see generally S. R. Norsworthy, R. Schier and G. C. Temes, "Delta-Sigma Data Converters: Theory, Design, and Simulations," *IEEE Press*, New York, 1997; P. Naus et al., "A CMOS Stereo 16-bit D/A Converter for Digital Audio," *IEEE Trans. on Solid-State Circuits*, pp. 390–395, vol. 22, no. 3, June 1987).

The quantizer 104 digitizes an analog voltage into a number of levels. For example, a one-bit quantizer, for an input voltage that is greater than zero, outputs a +1. For an input that is less than zero, the one-bit quantizer outputs -1. An N level quantizer divides the full scale (typically between -Fs and +Fs) into N levels, and outputs a discrete value accordingly. For example, for a three level quantizer, with full scale ranging from -1 volt to +1 volt, the quantizer will output discrete values at -0.5 and +0.5.

The output of the quantizer 104 introduces a quantization error, which may be fairly large. Therefore, the filter 108 is necessary to shape the frequency response. The fewer levels of quantization, the greater the quantization error.

FIG. 2 illustrates a modification of the circuit of FIG. 1. The modification includes the addition of a limiter 202 in the feedback path. The conventional value for the limiter is typically full scale (Fs) voltage, in other words, the limiter 202 does not permit the voltage in that particular feedback path to go above full scale.

The limiter transfer characteristic is shown in FIG. 3. The output of the limiter is saturated to full-scale (Fs) when the input of the limiter exceeds the Fs digital codes. When the modulator is overdriven, the error -e is bounded since both inputs are bounded, therefore, the modulator can be bring back to its stability when the modulator input is back to the normal range.

With the addition of the limiter 202, the inputs to the summer 106 are bounded, thereby reducing instability and oscillation of the output Y. FIG. 3 shows the transfer function of a conventional limiter 202. As shown in FIG. 3, once the input reaches a certain value, normally Fs, the output is flat at Fs as well.

The instability of the structure such as that shown in FIG. 1 when the input X approaches full scale is easily seen at the output Y, which does not reflect the input when the input is close to Fs. FIG. 4 shows a spectrum of the output Y, using a circuit of FIG. 2. As may be seen in FIG. 4, with an input of 2 KHz, strong harmonics are observed at 6 KHz, 10 KHz, 14 KHz, 18 KHz, etc. When a perfect sine wave is clamped or saturated into a trapezoid shape (i.e., "flat on the top"), its spectrum contains not only the component at the fundamental frequency (i.e., the original input frequency), but also significant $2^{nd}$ order components (at twice the fundamental frequency), $3^{rd}$ order components (three times the fundamental frequency) and other higher order harmonics. The spectrum shown in FIG. 4 contains components not only the fundamental frequency of 2 KHz, but also higher-order harmonics of $3^{rd}$ order (at 6 KHz), $5^{th}$ order (at 10 KHz), $7^{th}$ order (at 14 KHz), etc. This is extremely undesirable, and represents distortion and nonlinearities.

However, the inventor has discovered that such a limiter 202 as described above is not optimal, because it saturates too early. This introduces unnecessary distortions and nonlinearities into the output of the error feedback modulator.

Accordingly, there is a need in the art for a Delta-Sigma modulator with lower distortion.

SUMMARY OF THE INVENTION

The present invention relates to an error feedback structure for Delta-Sigma modulators with improved stability that substantially obviate one or more of the disadvantages of the related art.

More particularly, in an exemplary embodiment of the present invention, an error feedback circuit includes a first summer receiving an analog input signal and a feedback signal and outputting a summed signal. A quantizer receives the summed signal and outputs a quantized output signal. A limiter receives the summed signal and outputs a limited summed signal. The limiter limits the limited summed signal to $\alpha*$(full scale input signal, i.e., the maximum value that the input signal can have), $\alpha>1$. A second summer receives the limited summed signal and the output signal and outputs an error signal. A filter receives the error signal and outputting the feedback signal. Typically, $1.0<\alpha<2.0$, more preferably $1.4<\alpha<1.6$. The filter has a transfer function of $H_1(z)=2z^{-1}-z^{-2}$.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings.

Figure 1:
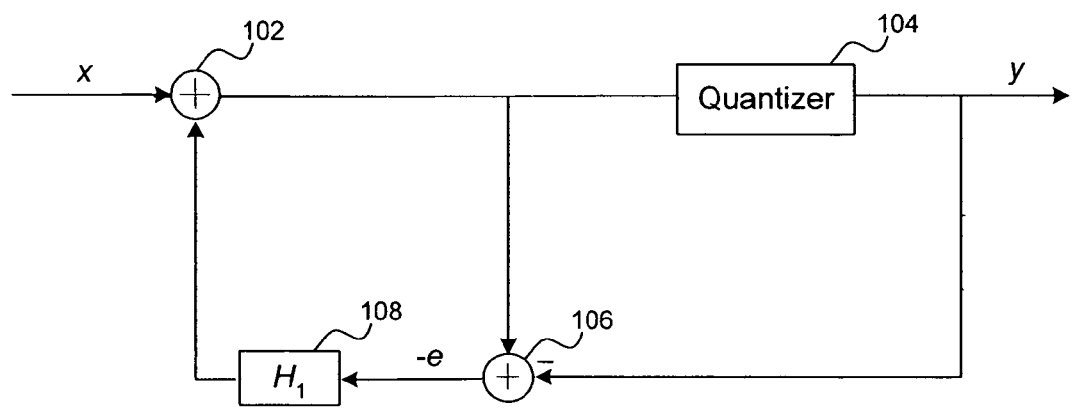
FIG. 1 illustrates a conventional error feedback (EFB) structure used in Delta-Sigma modulators.
Figure 2:
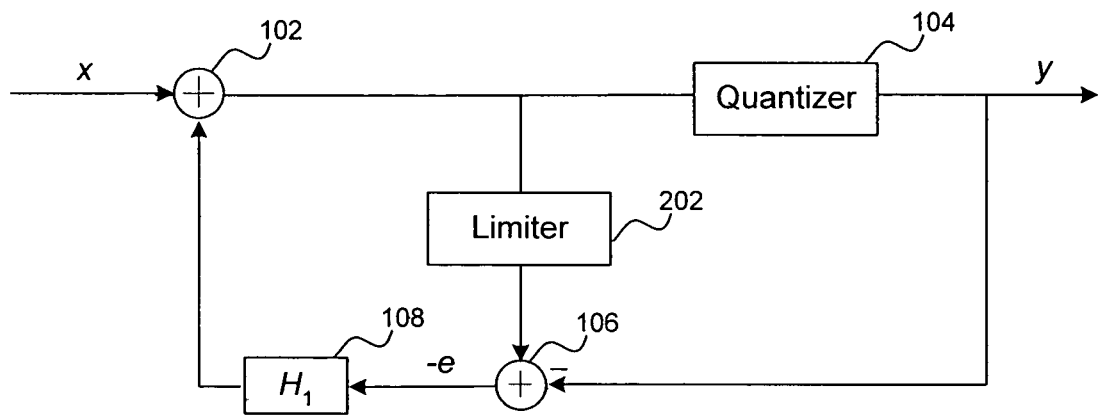
FIG. 2 shows the addition of a limiter to the circuit of FIG. 1.
Figure 3:
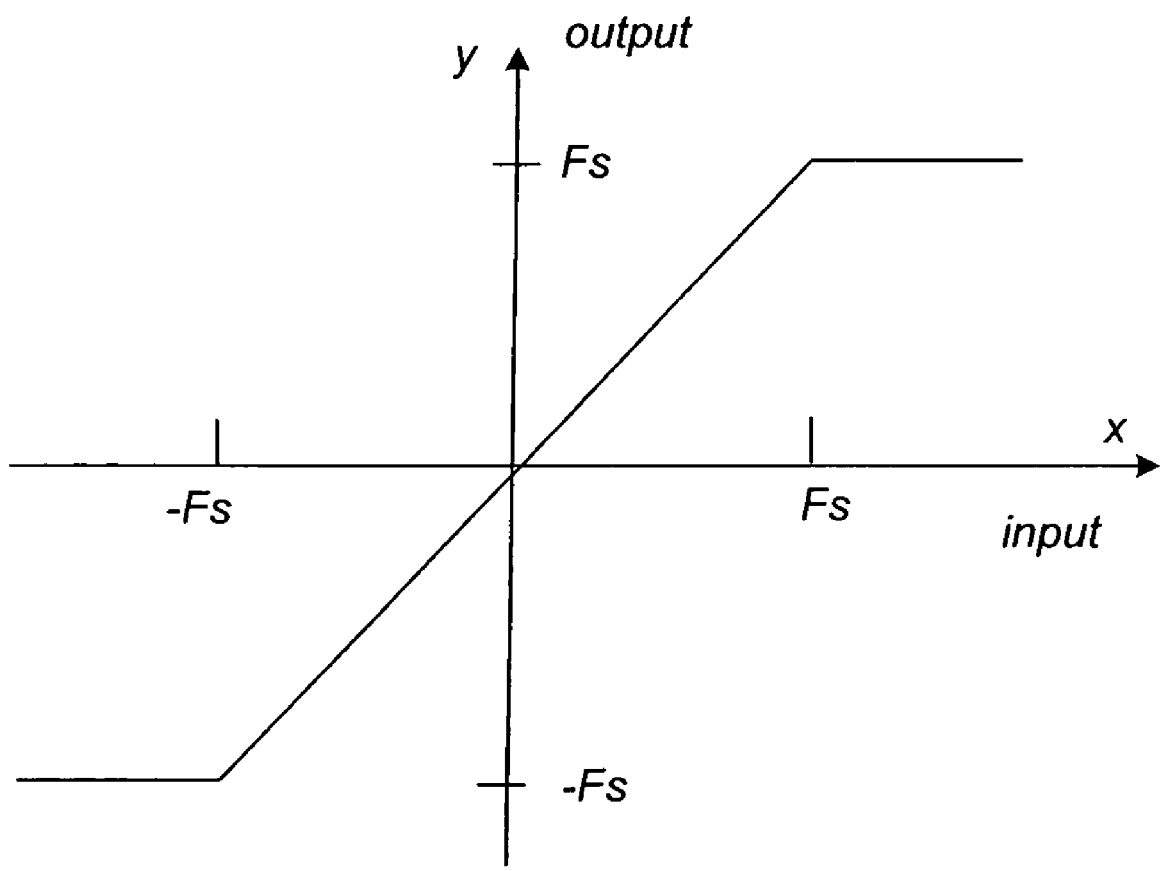
FIG. 3 shows the conventional limiter transfer characteristic.
Figure 5:
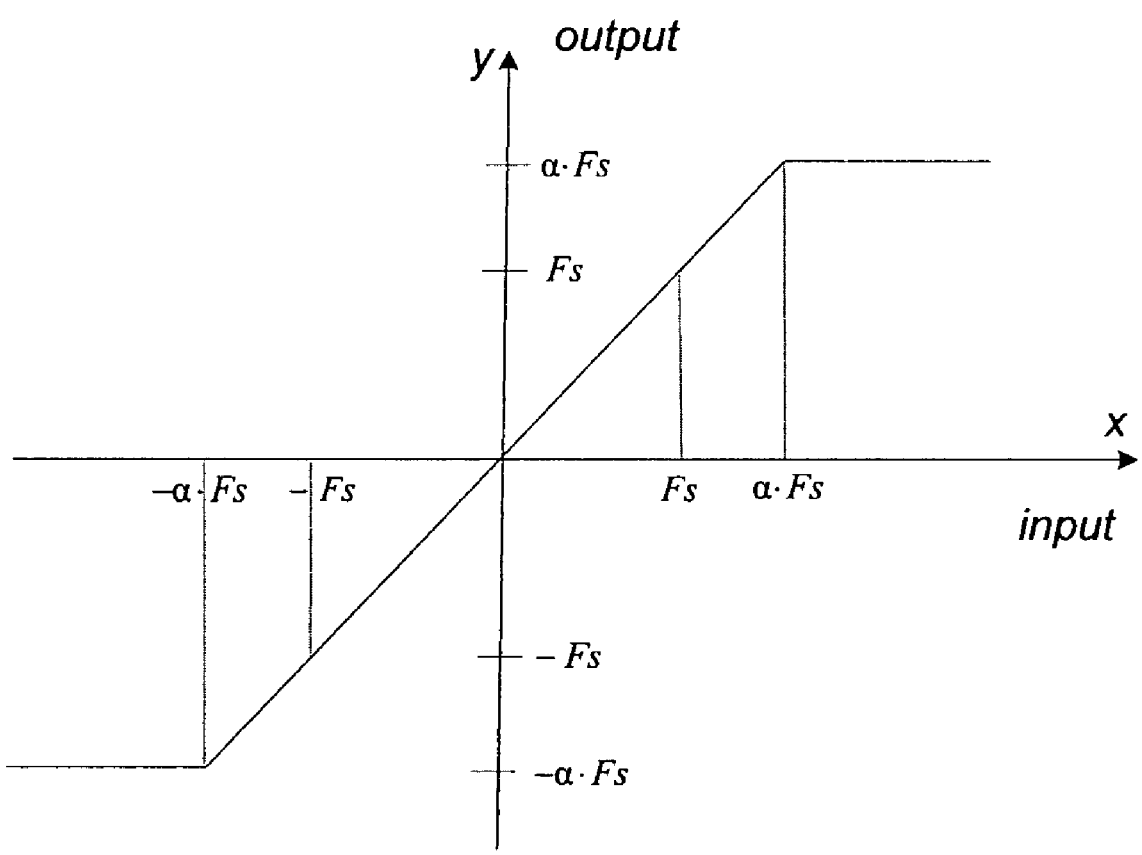
FIG. 5 illustrates the transfer function characteristics of a limiter of the present invention.
Figure 7:
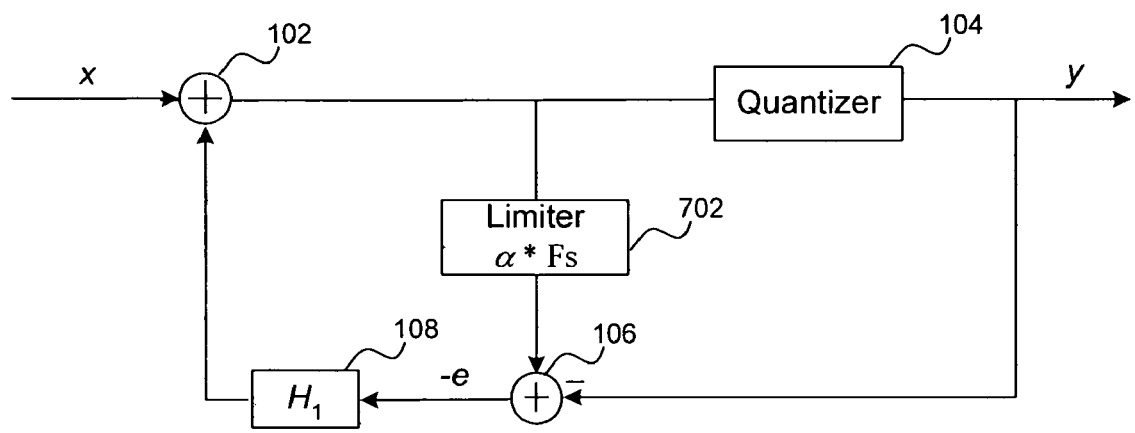
FIG. 7 illustrates an error feedback modulator using the limiter of the present invention.

The conventional technique to prevent the overflow can be further improved. There is a optimal scaling factor $1<\alpha<2$, that yields better SNDR. The associated limiter transfer characteristic is shown in FIG. 5. FIG. 7 illustrates an error feedback modulator using a limiter 702, with the scaling factor $\alpha$. The other components of the error feedback modulator are similar to those shown in FIG. 2.

FIG. 5 illustrates the transfer function characteristics of the limiter 702 of the present invention. As may be seen from FIG. 5, rather than limiting the voltage in its feedback path at Fs (full scale, i.e., the maximum value that the input signal can have), the limiter 702 of the present invention limits it at some value greater than Fs, in other words $\alpha \times Fs$. The parameter $\alpha$ is typically between 1.0 and 2.0, more preferably between 1.3 and 1.7, more preferably still between 1.4 and 1.6.

Figure 4:
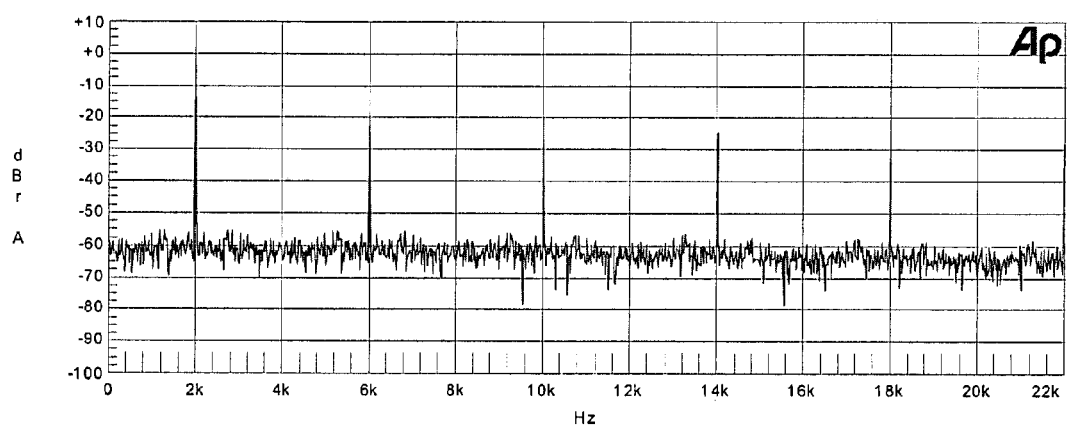
FIG. 4 shows a spectrum of the output of the circuit of FIG. 2.

In other words, the linear range has been extended from (−Fs to +Fs) to (−$\alpha*$(Fs) to +$\alpha*$(Fs)). Thus, the limiter 702 with a transfer function characteristic shown in FIG. 4 more accurately reflects the input X, while still performing the limiting function.

It will be appreciated that with $\alpha$ approaching 1.0, the effect of the invention will be less and less, since the input X will saturate earlier and earlier. On the other hand, with $\alpha$ approaching about 2.0, the limiting function of the limiter becomes moot, and there is greater likelihood of oscillation and instability. Thus, a value of $\alpha$ of approximately 1.5 is believed to be optimal.

If $\alpha$ is too big (greater than 2), the limiter 702 becomes ineffective, the quantization error −e becomes unbounded, and the modulator is unstable. If $\alpha$ is too small (close to 1), the limiter 702 saturates the signal that is still in the linear range, results in large distortion and low SNDR. From computer simulations, it was found that $\alpha \approx 1.5$ gives the best result. Table 1 below shows the measurement results from a test chip. The output SNDR of the modulator using the invention ($\alpha=1.5$) is always better than using a conventional limiter 202.

TABLE 1

| SNDR comparison for a full-scale sine input with various input frequencies. | | | | |
|---|---|---|---|---|
| Input frequency | 0.5 KHz | 1 KHz | 2 KHz | 3 KHz |
| SNDR for conventional circuit | 15.8 dB | 16.5 dB | 17.8 dB | 18.6 dB |
| SNDR for the invention | 37.0 dB | 46 dB | 62.5 dB | 55 dB |

As the above tables shows, the present invention allows a dramatic reduction in non-linearity. (SNDR is a parameter that is normally used to measure the performance of an error feedback modulator.)

Figure 6:
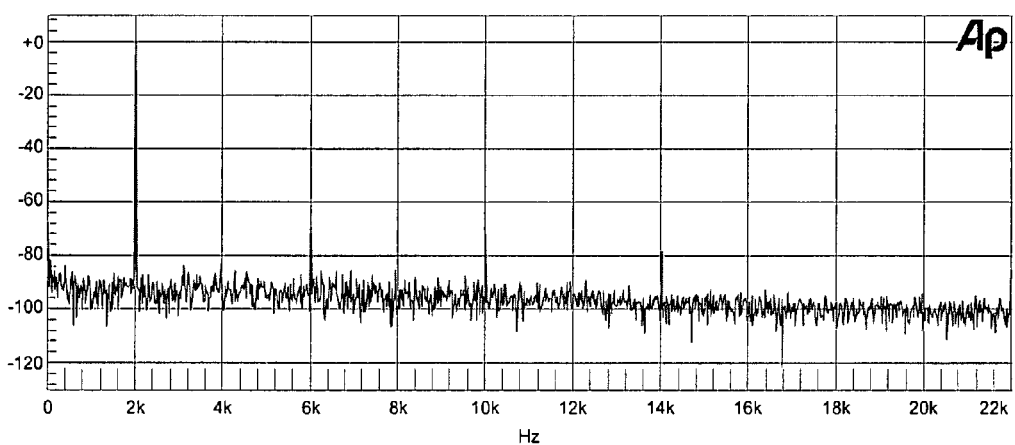
FIG. 6 illustrates the frequency response of the output using the limiter of the present invention.

FIG. 6 illustrates the frequency response of the output Y using the limiter 702 of the present invention, where the FFT demonstrates much lower distortion (as evident from much smaller harmonics in the FFT). As shown in FIG. 6, particularly in comparison with FIG. 4, the harmonics are dramatically reduced, thereby reducing non-linearities and distortions.

CONCLUSION

It should also be appreciated that various modifications, adaptations, and alternative embodiments thereof may be made within the scope and spirit of the present invention. The invention is further defined by the following claims.

What is claimed is:

1. An error feedback circuit comprising:
    a first summer receiving an analog input signal and a feedback signal and outputting a summed signal;
    a quantizer receiving the summed signal and outputting a quantized output signal;
    a limiter receiving the summed signal and outputting a limited summed signal, wherein the limiter limits the limited summed signal to $\alpha*$(maximum value of input signal), $\alpha>1$;
    a second summer receiving the limited summed signal and the quantized output signal and outputting an error signal; and
    a second order filter receiving the error signal and outputting the feedback signal.

2. The error feedback circuit of claim 1, wherein $1.0<\alpha<2.0$.

3. The error feedback circuit of claim 1, wherein $1.4<\alpha<1.6$.

4. The error feedback circuit of claim 1, wherein the second order filter has a transfer function of $H_1(z)=2z^{-1}-z^{-2}$.

5. A modulator circuit comprising:
- a first summer receiving an input signal and a filtered error signal and outputting a signal representing a sum of the input and feedback signals;
- a quantizer receiving the sum and outputting a quantized signal;
- a limiter receiving the sum and outputting a limited signal that is no greater than $\alpha*$(maximum value of input signal), $\alpha>1$;
- a second summer receiving the limited signal and the quantized signal and outputting an error signal; and
- a second order filter receiving the error signal and outputting the filtered error signal.

6. The error feedback circuit of claim 5, wherein $1.0<\alpha<2.0$.

7. The error feedback circuit of claim 5, wherein $1.4<\alpha<1.6$.

8. The error feedback circuit of claim 5, wherein the second order filter has a transfer function of $H_1(z)=2z^{-1}-z^{-2}$.

* * * * *

UNITED STATES PATENT AND TRADEMARK OFFICE
CERTIFICATE OF CORRECTION

| | | |
|---|---|---|
| PATENT NO. | : 6,956,513 B1 | Page 1 of 1 |
| APPLICATION NO. | : 10/969852 | |
| DATED | : October 18, 2005 | |
| INVENTOR(S) | : Minsheng Wang | |

It is certified that error appears in the above-identified patent and that said Letters Patent is hereby corrected as shown below:

Column 6,
Lines 6, 8 and 10, replace "error feedback circuit" with -- modulator circuit --.

Signed and Sealed this

Twentieth Day of June, 2006

JON W. DUDAS
*Director of the United States Patent and Trademark Office*